(12) United States Patent
Kong et al.

(10) Patent No.: US 9,637,839 B2
(45) Date of Patent: May 2, 2017

(54) SYNTHESIS AND TRANSFER OF METAL DICHALCOGENIDE LAYERS ON DIVERSE SURFACES

(71) Applicant: Massachusetts Institute of Technology, Cambridge, MA (US)

(72) Inventors: Jing Kong, Winchester, MA (US); Lain-Jong Li, Jubei (TW); Yi-Hsien Lee, New Taipei (TW)

(73) Assignee: Massachusetts Institute of Technology, Cambridge, MA (US)

( * ) Notice: Subject to any disclaimer, the term of this patent is extended or adjusted under 35 U.S.C. 154(b) by 421 days.

(21) Appl. No.: 14/193,962

(22) Filed: Feb. 28, 2014

(65) Prior Publication Data
US 2014/0245946 A1    Sep. 4, 2014

Related U.S. Application Data

(60) Provisional application No. 61/771,692, filed on Mar. 1, 2013.

(51) Int. Cl.
| | |
|---|---|
| *C30B 25/18* | (2006.01) |
| *C23C 16/00* | (2006.01) |
| *C30B 29/46* | (2006.01) |
| *C01B 31/04* | (2006.01) |
| *B23B 9/00* | (2006.01) |
| *H01L 23/58* | (2006.01) |

(52) U.S. Cl.
CPC ............ *C30B 25/186* (2013.01); *C23C 16/00* (2013.01); *C30B 29/46* (2013.01); *B23B 9/00* (2013.01); *C01B 31/04* (2013.01); *H01L 23/58* (2013.01)

(58) Field of Classification Search
CPC ......... C23C 16/00; H01L 23/58; C01B 31/04; B32B 9/00; C30B 25/18; C30B 25/183
See application file for complete search history.

(56) References Cited

U.S. PATENT DOCUMENTS

| | | | |
|---|---|---|---|
| 6,827,826 B2 | 12/2004 | Demaray et al. | |
| 8,535,553 B2 | 9/2013 | Kong et al. | |
| 8,592,291 B2 | 11/2013 | Shi et al. | |
| 2002/0132495 A1 | 9/2002 | Siegel et al. | |
| 2004/0018306 A1 | 1/2004 | Tenne et al. | |

FOREIGN PATENT DOCUMENTS

WO    2012/161660 A1    11/2012

OTHER PUBLICATIONS

United States Patent and Trademark Office, International Search Report and Written Opinion for PCT/US14/19575 (related PCT application) (Jun. 17, 2014).
Coleman, Jonathan N., et al., "Two-Dimensional Nanosheets Produced by Liquid Exfoliation of Layered Materials", Science, vol. 331, pp. 568-571 and supporting online material (Feb. 4, 2011).

(Continued)

*Primary Examiner* — Matthew Song
(74) *Attorney, Agent, or Firm* — Modern Times Legal; Robert J. Sayre (57) ABSTRACT

Aromatic molecules are seeded on a surface of a growth substrate; and a layer (e.g., a monolayer) of a metal dichalcogenide is grown via chemical vapor deposition on the growth substrate surface seeded with aromatic molecules. The seeded aromatic molecules are contacted with a solvent that releases the metal dichalcogenide layer from the growth substrate. The metal dichalcogenide layer can be released with an adhered transfer medium and can be deposited on a target substrate.

19 Claims, 10 Drawing Sheets

(56) References Cited

OTHER PUBLICATIONS

Helveg, S., et al., "Atomic-Scale Structure of Single-Layer $MoS_2$ Nanoclusters", Physical Review Letters, vol. 84, No. 5, pp. 951-954 (Jan. 31, 2000).

Lauritsen, Jeppe V., et al., "Size-dependent structure of $MoS_2$ nanocrystals", Nature Nanotechnology, pp. 53-58 (Jan. 3, 2007).

Lee, Yi-Hsien, et al., "Synthesis of Large-Area $MoS_2$ Atomic Layers with Chemical Vapor Deposition", Advanced Materials, vol. 24, Issue 17, pp. 2320-2325 (Mar. 30, 2012).

Li, Xiao L., et al., "Formation of $MoS_2$ Inorganic Fullerenes (IFs) by the Reaction of MoO3 Nanobelts and S", Chem. Eur. J., vol. 9, Issue 12, pp. 2726-2731 (Jun. 16, 2013).

Liu, Keng-Ku, et al., "Growth of Large-Area and Highly Crystalline $MoS_2$ Thin Layers on Insulating Substrates", Nano Letters, pp. 1538-1544 (Feb. 27, 2012).

Mak, Kin F., et al., "Atomically Thin $MoS_2$: A New Direct-Gap Semiconductor", Phys. Rev. Lett., pp. 136805-1-136805-4 (Sep. 24, 2010).

Radisavljevic, B., et al., "Single-layer $MoS_2$ transistors", Nature Nanotechnology Letters, Vo. 6, pp. 147-150 (Jan. 30, 2011).

Shi, Yumeng, et al., "van der Weals Epitaxy of $MoS_2$ Layers Using Graphene As Growth Templates", Nano Letters, pp. 2784-2791 (May 29, 2012).

Splendiani, Andrea, et al., "Emerging Photoluminescence in Monolayer $MoS_2$", Nano Letters, pp. 1271-1275 (Mar. 15, 2010).

Wang, Han, et al., "Integrated Circuits Based on Bilayer $MoS_2$ Transistors", Nano Letters, pp. 4674-4680 (Aug. 3, 2012).

Wang, Wenlong, et al., "Aqueous Noncovalent Functionalization and Controlled Near-Surface Carbon Doping of Multiwalled Boron Nitride Nanotubes", J. Am. Chem. Soc., pp. 8144-8145 and supporting information (Jun. 10, 2008).

Zhan, Yongjie, et al., "Large-Area Vapor-Phase Growth and Characterization of $MoS_2$ Atomic Layers on a $SiO_2$ Substrate", Small, pp. 1-18 (Feb. 15, 2012).

SYNTHESIS AND TRANSFER OF METAL DICHALCOGENIDE LAYERS ON DIVERSE SURFACES

RELATED APPLICATION

This application claims the benefit of U.S. Provisional Application No. 61/771,692, filed 1 Mar. 2013, the entire content of which is incorporated herein by reference.

GOVERNMENT SUPPORT

This invention was made with Government support under Grant No.DMR 0845358 awarded by the National Science Foundation. The Government has certain rights in this invention.

BACKGROUND

Recently, monolayers of layered transition metal dichalcogenides (LTMDs), such as $MX_2$ (where M=Mo or W and where X=S or Se), have been reported to exhibit significant spin-valley coupling and optoelectronic performances because of their unique structural symmetry and band structures. Monolayers in this class of materials offered a burgeoning field in fundamental physics, energy harvesting, electronics and optoelectronics. Most studies to date, however, are hindered by the great challenges of synthesizing and transferring high-quality LTMD monolayers. Hence, a feasible synthetic process to overcome these challenges would be advantageous.

Considerable efforts have been devoted to synthesize an $MoS_2$ monolayer, including various kinds of exfoliations, physical vapor deposition, and chemical vapor deposition (CVD). Recently, a CVD-$MoS_2$ monolayer was presented with sulfurization of the thin Mo layer and induced layer growth using fragments of reduced graphene oxide as seeds. Y. Zhan, et. al, "Large-area vapor-phase growth and characterization of $MoS_2$ atomic layers on a $SiO_2$ substrate," Small, 8, 966-971 (2012). The as-grown layers, however, displayed obvious thickness variation; and their optoelectronic performance was a few orders of magnitudes worse than that of exfoliated layers. Further applications and scientific study have been hindered due to reduced mobility and a low on-off current ratio because of the high defect concentration and small grain size. Accordingly, most studies still use exfoliated samples since the synthesis of high-quality LTMD monolayers has remained a great challenge thus far.

SUMMARY

Methods for fabricating and transferring a metal dichalcogenide and related structures are described herein. Various exemplifications of the methods and structures may include some or all of the elements, features and steps, described below.

In various embodiments of the method, aromatic molecules are seeded on a surface of a growth substrate; and a layer (e.g., a monolayer) of a metal dichalcogenide is grown via chemical vapor deposition on the surface of the growth substrate seeded with aromatic molecules. The aromatic seeds on the surfaces enable the as-grown metal dichalcogenides layer to release from the growth substrate when exposed to solvent (e.g., de-ionized water).

In various embodiments, a transfer medium is adhered to the metal dichalcogenide layer before the metal dichalcogenide is released. Additionally, after release, the metal dichalcogenide layer can be transferred to a target substrate with a simple stamping.

The metal dichalcogenide can have a composition represented by the formula, $MX_2$, where M includes a metal selected from molybdenum (Mo) and tungsten (W), and where X is a chalcogen selected from sulfur (S), selenium (Se) and tellurium (Te). In one embodiment, X is sulfur and M is molybdenum; and the $MoS_2$ layer is grown at a temperature of about 650° C. In another embodiment, X is sulfur and M is tungsten; and the $WS_2$ layer is grown at a temperature of about 800° C.

In various embodiments, the chalcogen is evaporated into a vapor phase and carried with inner carrier gas (e.g., nitrogen or argon gas) flow in the chemical vapor deposition. The metal can be supplied as $MO_3$ in the chemical vapor deposition. Moreover, the chemical vapor deposition can be performed at ambient pressure.

In various embodiments, the aromatic molecules are dissolved in de-ionized water; and the aromatic layer can be, e.g., reduced graphene oxide (r-GO), perylene-3,4,9,10-tetracarboxylic dianhydride (PTCDA), or perylene-3,4,9,10-tetracarboxylic acid tetrapotassium salt (PTAS).

The as-grown metal dichalcogenide layer can be in the form of a monolayer. The solvent can be, e.g., deionized water, and the transfer medium can be, e.g., polydimethylsiloxane (PDMS) or poly(methyl methacrylate) (PMMA). Meanwhile, the growth substrate can be formed of, e.g., $SiO_2$/Si; and the target substrate can be formed of, e.g., quartz, sapphire or silica.

Particular embodiments demonstrate the growth of high-quality $MS_2$ monolayers (where M=Mo or W) using ambient-pressure chemical vapor deposition (APCVD) with the seeding of perylene-3,4,9,10-tetracarboxylic acid tetrapotassium salt (PTAS) on a growth substrate. The growth of a $MS_2$ monolayer can be achieved on various substrate surfaces with significant flexibility to surface corrugation; and the electronic transport and optical performances of the as-grown $MS_2$ monolayers are comparable to those of exfoliated $MS_2$ monolayers. Also demonstrated is a robust technique for transferring $MS_2$ monolayer samples to diverse surfaces, which may stimulate progress on this class of materials and open a new route toward the synthesis of various novel hybrid structures including LTMD monolayer and functional materials.

Advantages that can be offered by various embodiments include the following. First, numerous novel performance and unique optical properties can be observed in the LTMD monolayer. Second, these methods of fabrication enable direct growth of an LTMD monolayer on diverse surfaces or nanostructures. Third, these methods of fabrication are scalable and enable formation of a high-quality LTMD monolayer. Fourth, these methods of fabrication can be simple and low-cost. Fifth, these structures can be fabricated at low growth temperatures.

Exemplary applications for these monolayers (i.e., devices in which these monolayers can be included) include the following: flexible electronics and optoelectronics; hybrid heterostructures with two-dimensional materials; advanced semiconductor devices and integrated circuits; short-channel devices and electronic circuits requiring low stand-by power; novel physical phenomenon and spin-related devices; valleytronics devices; energy harvesting issues, such as water splitting and hydrogen production; batteries and supercapacitors.

BRIEF DESCRIPTION OF THE DRAWINGS

FIG. 6b are the corresponding SAED patterns of the different regions shown in FIG. 6a.

In the accompanying drawings, like reference characters refer to the same or similar parts throughout the different views; and apostrophes are used to differentiate multiple instances of the same or similar items sharing the same reference numeral. The drawings are not necessarily to scale, emphasis instead being placed upon illustrating particular principles, discussed below.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2%, wherein percentages or concentrations expressed herein can be either by weight or by volume) can be understood as being within the scope of the description; likewise, if a particular shape is referenced, the shape is intended to include imperfect variations from ideal shapes, e.g., due to manufacturing tolerances.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to" or "coupled to" another element, it may be directly on, connected or coupled to the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Layered transition metal dichalcogenides (LTMDs), including $MX_2$ (where M=Mo or W and where X=S, Se or Te), have attracted extensive research efforts in the fields of nanotribology, catalysis, energy harvesting, and optoelectronics. Monolayers of two-dimensional crystals, such as graphene, have been highlighted regarding both scientific and industrial aspects due to novel physical phenomenon inherited from the reduced dimensionality. Similarly, the broken inversion symmetry and the indirect-to-direct bandgap transition of LTMD are observed when the dimension is reduced from multilayers to a monolayer. The LTMD monolayers (being considered as the thinnest semiconductors) exhibit great potential for advanced short-channel devices.

A transistor fabricated with an exfoliated $MoS_2$ monolayer displays a high on-off current ratio and good electrical performance, both of which are advantageous for an electronic circuit requiring low stand-by power. Recent theoretical predictions suggest that the dissociation of $H_2O$ can be realized at defects in single-layer $MoS_2$, which is highly advantageous for developing clean and sustainable energy from hydrogen. Moreover, monolayer $MoS_2$ and $WS_2$ have been considered as ideal materials for exploring valleytronics and valley-based optoelectronic applications. The broken inversion symmetry of the monolayer and the strong spin-orbit coupling lead to a fascinating interplay between spin and valley physics, enable simultaneous control over the spin and valley degrees of freedom, and create an avenue toward the integration of spintronics and valleytronics applications.

The synthesis of an LTMD monolayer may be achieved using various aromatic molecules as seeds on a growth substrate. Using an aromatic-molecule seed with high thermal stability and exercising better control of the seeding treatment on surfaces can overcome the challenges associated with the synthesis of a high-quality LTMD monolayer. Additionally, a robust transfer technique that avoids degradation in quality and contamination is presented that is particularly advantageous for fundamental physics and optoelectronic applications. Particular embodiments, described herein, demonstrate that high-quality $MS_2$ monolayers can be directly synthesized on various surfaces using a scalable APCVD process with the seeding of perylene-3,4,9,10-tetracarboxylic acid tetrapotassium salt (PTAS). Not only is the growth successful on surfaces of different materials, but it has been found that the deposition method is also applicable for surfaces with various morphologies. The as-synthesized $MS_2$ monolayer exhibits a single crystalline structure with a specific flake shape even on amorphous surfaces. Meanwhile, a reliable transfer technique is also presented herein to enable $MS_2$ monolayer growth on flexible substrates or surfaces of various functional materials while maintaining their high quality.

Figure 1:
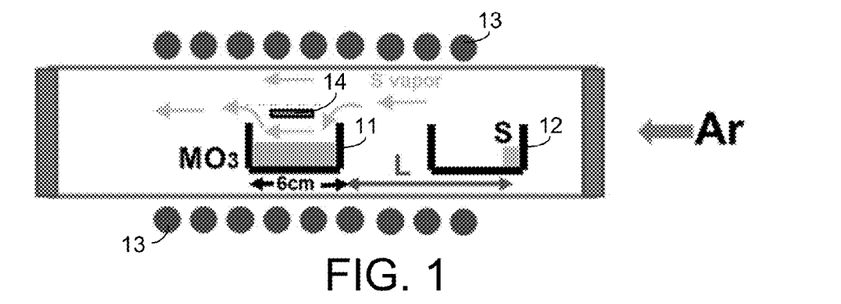
FIG. 1 is a schematic diagram of an experimental setup for the synthesis of a $MS_2$ monolayer.

A schematic illustration of an experimental setup for forming an $MoS_2$ monolayer is shown in FIG. 1. In one embodiment, high-purity $MoO_3$ (99%, Aldrich), $WO_3$ (99%, Alfa), and S powder (99.5%, Alfa) are used as starting reactants. The $MO_3$ (where M=Mo or W) powders and S powders are placed in different crucibles 11 and 12 over which a substrate 14 is passed while being heated by heating elements 13 to form the $MoS_2$ monolayer thereon.

Figure 2A:
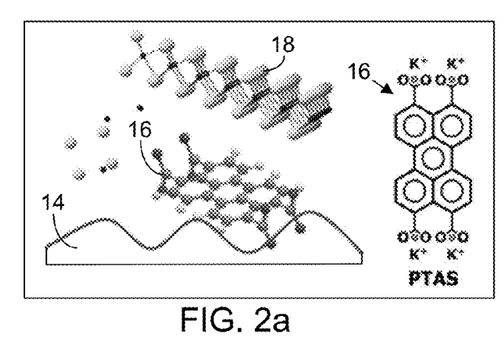
FIG. 2a provides an illustration of the chemical structure of PTAS (right) and a schematic picture for the growth process on diverse surfaces (left).
Figure 2B:
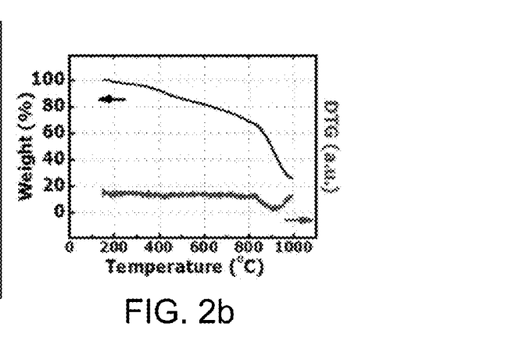
FIG. 2b plots the temperature dependence of the weight loss and differential weight loss of PTAS using thermogravimetry analysis (TGA).
Figure 2C:
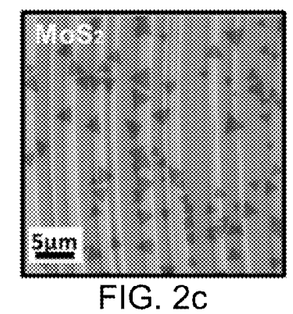
FIG. 2c provides an SEM image of $MoS_2$ grown on the cleaved side-wall of a Si substrate.
Figure 2D:
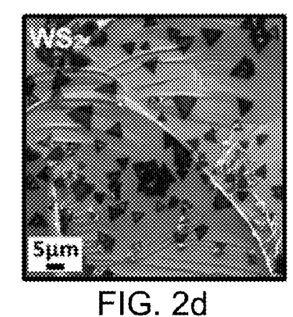
FIG. 2d provides an SEM image of $WS_2$ grown on the cleaved side-wall of a Si substrate.
Figure 2E:
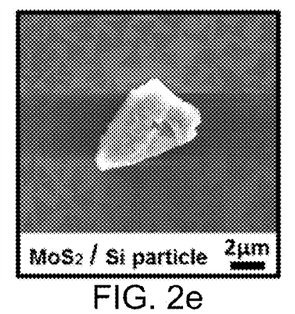
FIG. 2e provides an SEM image of monolayer $MoS_2$ on a 5 μm Si particle.
Figure 2F:
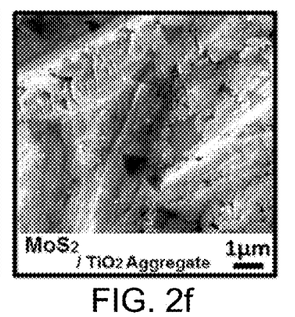
FIG. 2f provides an SEM image of monolayer $MoS_2$ on aggregates of $TiO_2$ nanoparticles.

FIG. 2a shows the chemical formula of PTAS, used as aromatic molecules 16 seeded onto the substrate 14, and a schematic diagram for an exemplary growth mechanism of a metal dichalcogenide (e.g., $MoS_2$) on any of a variety of diverse substrate 14 surfaces. The high solubility of PTAS in water enables the seed solution to be uniformly distributed on hydrophilic growth-substrate surfaces. Compared to other aromatic molecules, PTAS survives better at a higher temperature. In FIG. 2b, thermogravimetric analysis (TGA) of PTAS demonstrates good thermal stability and a slow decomposition rate when the growth temperature is below 820° C. Both $MoS_2$ and $WS_2$ can be directly grown on corrugated surfaces of Si, as shown in FIGS. 2c and 2d. Moreover, the growth of $MoS_2$ on diverse surfaces, including Si particles, $TiO_2$ nano particles, sapphire, and quartz, displays a similar growth behavior, as shown in FIGS. 2e and 2f, respectively.

Figure 3A:
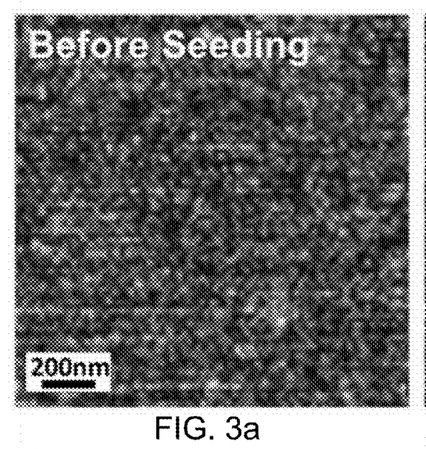
FIG. 3a is an AFM image of the surface of a $SiO_2$/Si substrate prior to seed treatment.
Figure 3B:
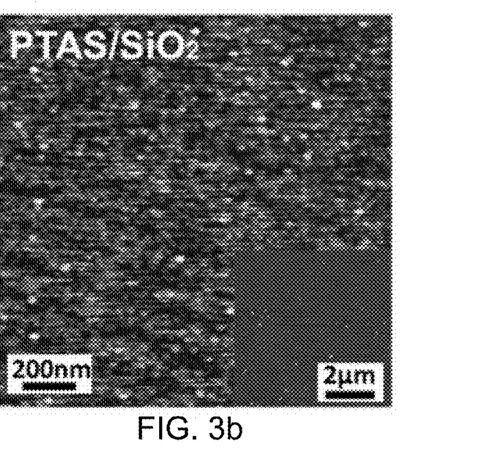
FIG. 3b is an AFM image of the surface of the substrate of FIG. 3a after seed treatment and after the same heating procedures as used in the growth of $MoS_2$.

The distribution and morphology of the PTAS seeds is monitored with atomic force microscopy (AFM), as shown in FIG. 3b. After drying the solvent, uniform and tiny seeds of PTAS appear on the surfaces. Some randomly distributed aggregation of seeds is also observed in the inset of FIG. 3b. The particle-like aggregation of PTAS may provide a nucleation site to host the $MoS_2$ nuclei; and, then, further layer growth is rapidly activated under the growth conditions specified herein. For comparison, the surface, before seeding, is shown in FIG. 3a.

Figure 3C:
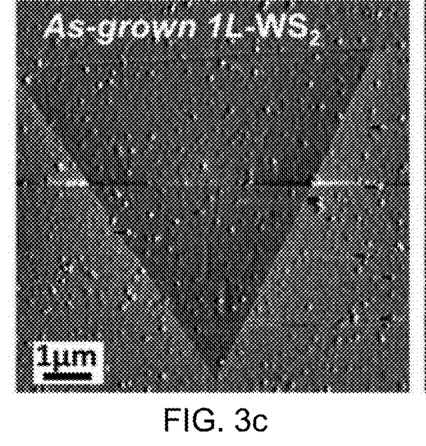
FIG. 3c is an AFM image of the surface of the substrate of FIG. 3b after a $WS_2$ monolayer is formed thereon.

The nucleation of $MoS_2$ nuclei may be the rate-controlling step for the seed-initiated-growth of $MoS_2$ layers for the following reasons. First, the as-synthesized $MX_2$ layer can directly grow over small amounts of seeds, as shown in FIG. 3c, which shows as-grown single-layer $WS_2$. Second, a reduced growth time facilitates single-layer $MoS_2$ growth and avoids further growth of $MoS_2$ to larger thickness. Third, further growth prefers to take place at the nucleation site, as shown in the inset of FIG. 5c. The island in the center is formed with the same edge orientation as that underneath $MoS_2$ flake, which is also a strong indication to support this idea of preferred growth initiation, and it is consistent with the single-crystal nature of $MoS_2$.

Figure 4A:
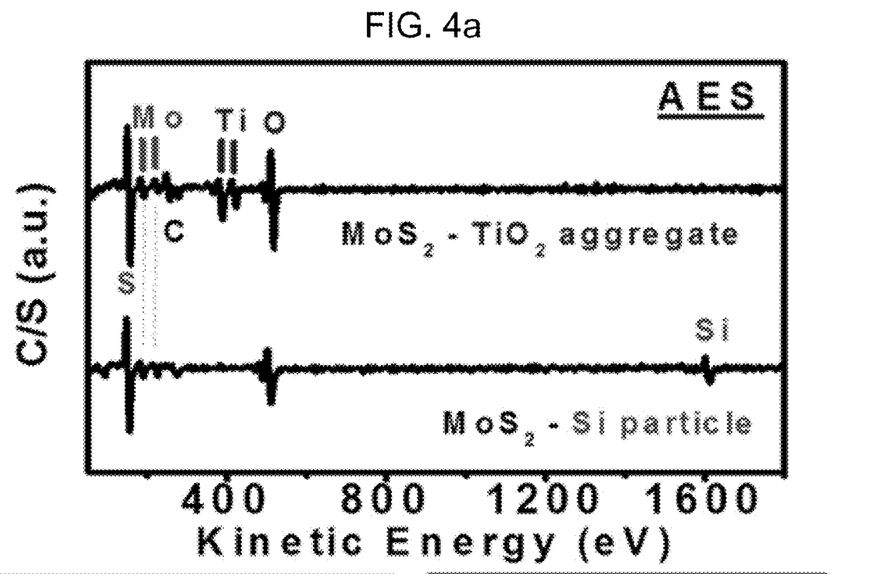
FIG. 4a plots nano-AES spectra for the as-grown $MoS_2$ on silicon particles and on an aggregation of $TiO_2$ nanoparticles.

In various embodiments, the flakes can be grown on a surface of a growth substrate 14 selected from the cleaved side-wall of a silicon substrate, the surface of micron-sized silicon particles, and an aggregation of $TiO_2$ nanoparticles. Furthermore, the flakes all show triangular shapes, which have been confirmed by transmission electron microscope (TEM) analysis to be single-crystalline domains. A Nano Auger electron microscope (Nano-AES, Phi) is employed to significantly verify the existence of $MS_2$ layers on various surfaces, as shown in the plots of FIG. 4a. The Nano-AES experiment is carried out with a working voltage of 10 kV in a UHV environment. The AES signals mainly come from the surfaces within a 5 nm depth and a spot size less than 10 nm, enabling their identification with high accuracy and resolution.

Figure 4B:
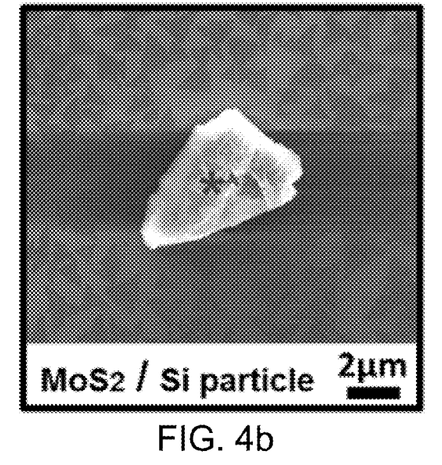
FIG. 4b is an SEM image of the as-grown $MoS_2$ on a silicon particle.
Figure 4C:
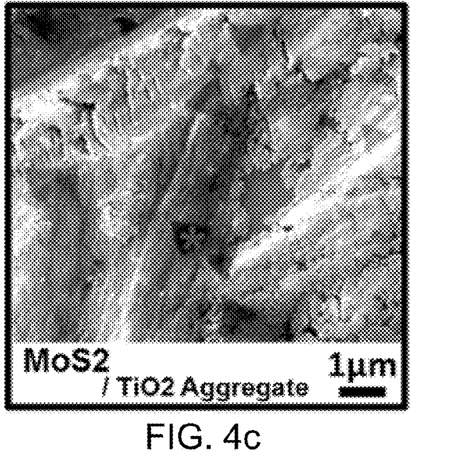
FIG. 4c is an SEM image of the as-grown $MoS_2$ on an aggregation of $TiO_2$ nanoparticles.

In particular embodiments, 0.01 g water-soluble Anatase-$TiO_2$ nanoparticles (T-nps, MK Impex Co) are mixed into the PTAS solution (100 μM) by sonication for 5 minutes. Prior to the growth, a drop of the mixture solution of T-nps and PTAS 16 is placed on the $SiO_2$/Si (i.e., silicon coated with a 300-nm layer of silica) substrate 14 and dried with blowing $N_2$ air. Further growth procedures are the same as for the growth of $MoS_2$. A magnified image of $MoS_2$ grown on silicon particles is provided in FIG. 4b, and a magnified image of $MoS_2$ grown on a $TiO_2$ aggregate is provided in FIG. 4c.

Figure 3D:
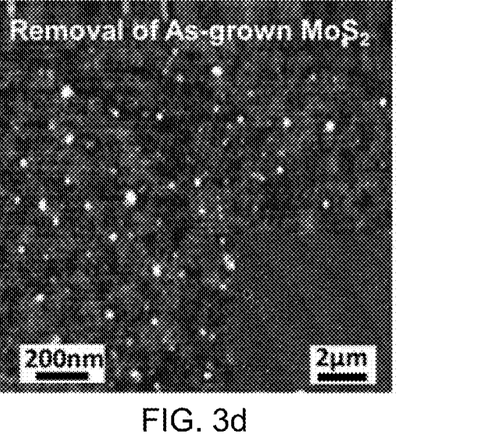
FIG. 3d is an AFM image of the surface of the substrate of FIG. 3c after removal of the as-grown $MoS_2$ monolayer.

With this better understanding of the synthesis process as well as the initial growth of $MoS_2$, synthesis of a monolayer $MX_2$ single crystal 18 is achievable by controlling the nucleation and growth rate of $MoS_2$. The selection of an appropriate seed 16 (e.g., with high thermal stability) and better control of the surface seeding process facilitates realization of this goal. In this work, PTAS is highlighted and selected as the seeds 16 for all experiments, because its high solubility in water enables the seed solution to be uniformly distributed on diverse hydrophilic surfaces. Moreover, the thermal analysis and the AFM image (FIG. 3d) of the surface after removal of the as-grown $MoS_2$ verify the stability and existence of the seeds.

It is worth noting that the synthesis process involves surface reactions among the reactants, and the synthesis process is governed by many factors including the seed density, seed size and gas flow. This study, however, shows that the synthesis of high-quality transition metal dichalcogenide (TMD) single layers 18 is achievable with extremely high reproducibility.

The $MS_2$ layers 18 were synthesized on diverse substrates 14 with APCVD. The PTAS solution was synthesized using perylene-3,4,9,10-tetracarboxylic dianhydride (PTCDA) following the procedures specified in W. Wang, et al., "Aqueous Noncovalent Functionalization and Controlled Near-Surface Carbon Doping of Multiwalled Boron Nitride Nanotubes," *J. Am. Chem. Soc.*, 130, 8144-8145 (2008). The substrates 14 for the growth were pre-treated with piranha solution (i.e., a 3:1 mixture of concentrated sulfuric acid to 30% hydrogen peroxide solution); and the surface residuals were removed via sonication in acetone, IPA and DI water for 10 minutes. Prior to growth of the $MS_2$ monolayer 18, a droplet of aqueous PTAS solution was spun on the substrates; and a gentle blow of gas on the substrate enabled the droplet to spread and uniformly precipitate into tiny seeds 16 on the surfaces of the various substrates 14. The $MoS_2$ and $WS_2$ layers were respectively synthesized at 650 and 800° C. for 5 minutes with a heating rate of 15° C./min and argon (Ar) flow at ambient pressure. Detailed parameters for this process are listed in Table 1, where the gas-flow rate is reported in standard cubic centimeters per minute (sccm), and where L is the distance between crucibles.

TABLE 1

| Monolayer composition | Temp. (° C.) | Seed concentration | Gas-flow rate | $MO_3$ | S | L |
|---|---|---|---|---|---|---|
| $MoS_2$ | 650 | 100 μM | 10 sccm | 0.03 g | 0.01 g | 18 cm |
| $WS_2$ | 800 | 1 mM | 5 sccm | 1 g | 0.015 g | 20 cm |

At the growth temperature, $MO_3$ powders were reduced by sulfur vapor to form volatile $MO_{3-x}$. Substrates 14 were facing down on the crucible, and the arriving $MO_{3-x}$ molecules reacted with sulfur vapor to form $MS_2$ 18 on the substrates 14. Without the seeds 16, only island growth of $MoS_2$ particles 18 was observed on bare $SiO_2$ surfaces. In contrast, the presence of PTAS seeds 16 on the surface enabled continuous layer growth, possibly via assisting the adsorption of molecules and the initiation of heterogeneous nucleation.

As shown in FIGS. 2c-2h, as-grown $MoS_2$ shows great flexibility and tolerance in response to surface corrugations. In FIGS. 2c and 2d, $MS_2$ flakes were uniformly grown on the cleaved side wall of silicon (Si) substrates. Most of the $MoS_2$ flakes are single-layer, while $WS_2$ flakes exhibited a slight variation in the number of layers. In FIG. 2e, a micron-sized Si particle is covered with single-layer $MoS_2$ flakes. FIG. 2f shows that the growth of $MoS_2$ flakes can even be achieved on aggregations of $TiO_2$ nanoparticles.

Figure 2G:
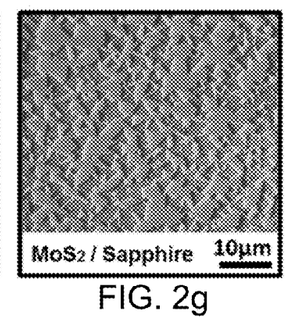
FIG. 2g provides an SEM image of monolayer $MoS_2$ on sapphire.
Figure 2H:
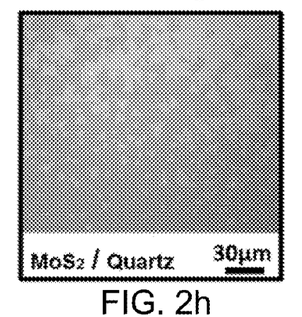
FIG. 2h is an optical microscope (OM) image of monolayer $MoS_2$ on quartz.

Nano-Auger electron spectroscopy was utilized to verify the existence of $MS_2$ layers, as shown in FIG. 4a. Furthermore, the growth of monolayer $MoS_2$ is achievable on crystalline surfaces, including quartz and sapphire, as shown in FIGS. 2g and 2h. The triangular single-layer $MoS_2$ flakes were commonly observed in the early stages of the growth. The ability to synthesize an LTMD monolayer with high tolerance to surface corrugation on diverse surfaces opens a route toward the synthesis of hetero- and composite structures.

Figure 5A:
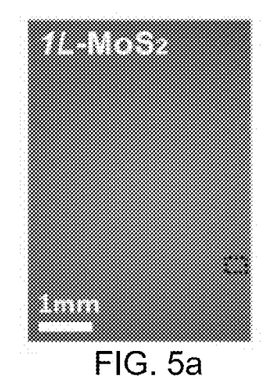
FIG. 5a provides an optical-microscope (OM) image of $MoS_2$ monolayer near an edge region.
Figure 5B:
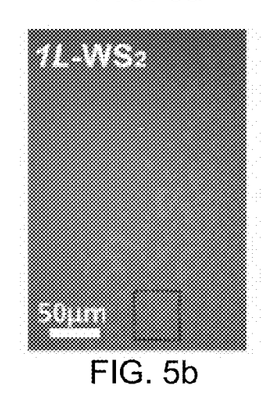
FIG. 5b provides an optical-microscope (OM) image of $WS_2$ monolayer near an edge region.
Figure 5C:
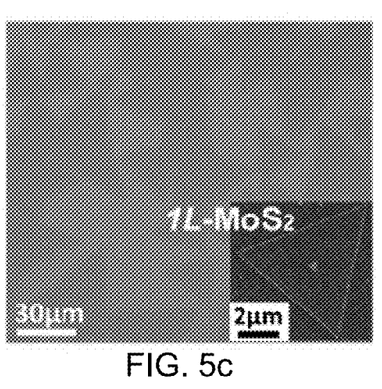
FIG. 5c provides an enlarged OM image of the marked area in FIG. 5a, with the inset showing the corresponding AFM images.
Figure 5D:
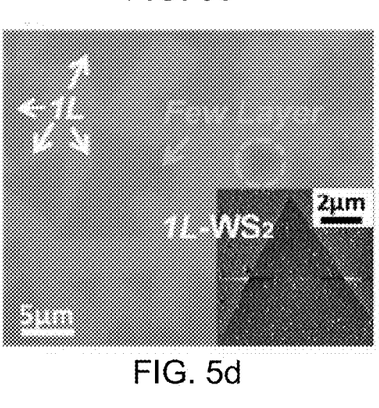
FIG. 5d provides an enlarged OM image of the marked area in FIG. 5b, with the inset showing the corresponding AFM images.
Figure 5E:
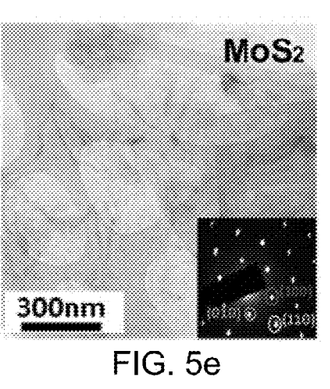
FIG. 5e provides a low-magnification TEM image of as-grown $MoS_2$, with the inset showing the corresponding SAED pattern.

In FIGS. 5a and 5b, uniform $MoS_2$ and $WS_2$ monolayers were grown on $SiO_2$/Si substrates using the methods described herein; and the as-grown $MoS_2$ and $WS_2$ monolayers had dimensions of greater than 1 cm and greater than 100 μm, respectively. The isolated $MS_2$ flakes appeared on the edge regions of the substrates (as shown in FIGS. 5c and 5d, where the insets show AFM images of $MoS_2$ and $WS_2$ monolayers with thicknesses of 0.71 and 0.86 nm, respectively). In the inset of FIG. 5c, there is an island in the center formed with the same edge orientation as the underlying $MoS_2$ flake, which is consistent with its single-crystal geometry.

Here, the nucleation is the rate-controlling step in the seed-initiated growth process. Additionally, the growth of $MS_2$ favoring layer growth in the initial growth stage with PTAS seeding is demonstrated by the as-synthesized $WS_2$ monolayer over small amounts of seeds (as shown in the inset of FIG. 5d) and by additional observation of an as-grown large-area monolayer.

Figure 5F:
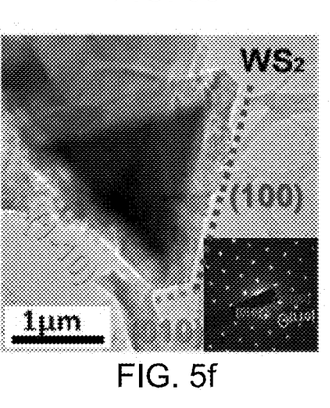
FIG. 5f provides a low-magnification TEM image of as-grown $WS_2$, with the inset showing the corresponding SAED pattern.
Figure 5G:
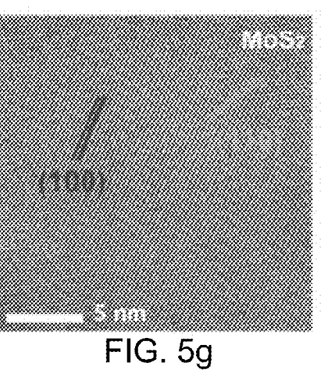
FIG. 5g provides a high-resolution TEM image of as-grown $MoS_2$.
Figure 5H:
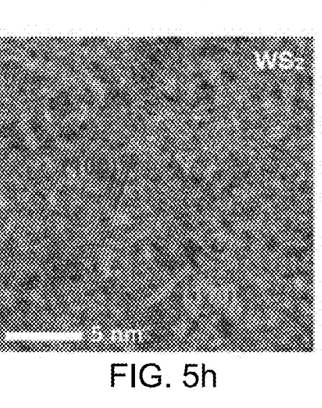
FIG. 5h provides a high-resolution TEM image of as-grown $WS_2$.
Figure 6A:
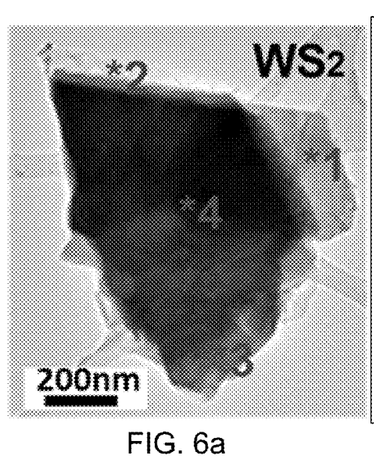
FIG. 6a is a low-magnification TEM image of a few-layer $WS_2$ flake, where the numbers mark regions with different thicknesses.

The crystal structure and edge structure of the as-grown $MS_2$ flakes were studied with a transition electron microscope (TEM). In FIGS. 5a-h, high-resolution TEM images and the corresponding selected-area-electron-diffraction (SAED) pattern with a [001] zone reveals the same hexagonal lattice structure and a similar lattice spacing for $MoS_2$ and $WS_2$. The spacing of (100) and (110) planes of both materials are 0.27 and 0.16 nm, respectively. FIG. 5f shows that the domain facets clearly align along (100), (010), and (1-10) planes. In FIG. 6a, a few-layer $WS_2$ flake is shown, and the SAED patterns at different locations indicate that the flake is single-crystal without any mis-orientations in the stacking of the layers. The single-crystal structure and specific edge structures are advantageous to explore fundamental edge states in this class of materials.

Figure 6B:
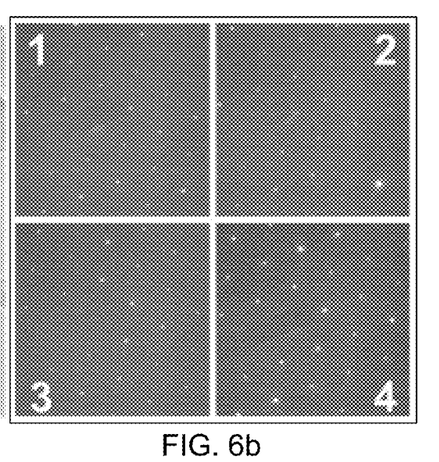
Figure 6C:
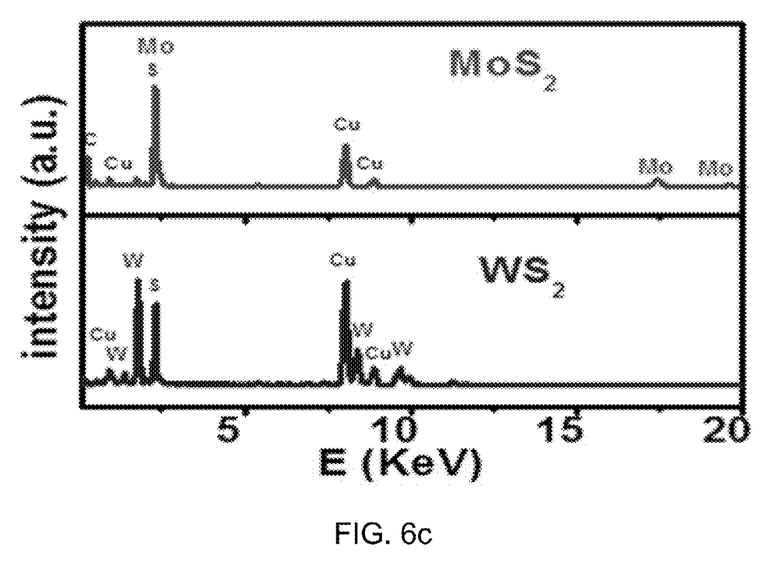
FIG. 6c plots the TEM-EDX spectra of the as-grown $MoS_2$ and $WS_2$.
Figure 7A:
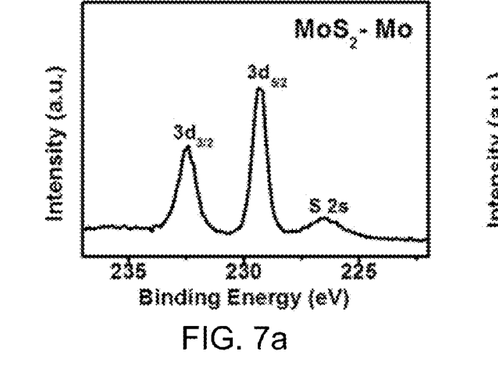
FIG. 7a plots the x-ray photoelectron spectra for the molybdenum (Mo) 3d orbit of the as-grown $MoS_2$.
Figure 7B:
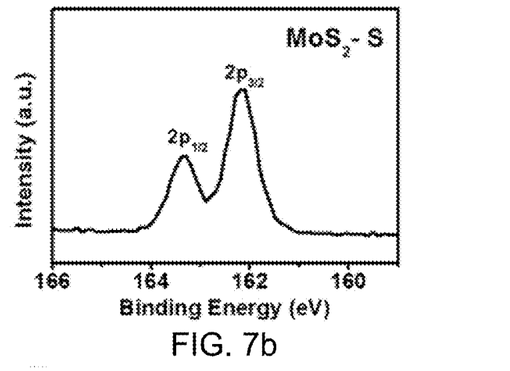
FIG. 7b plots the x-ray photoelectron spectra for the sulfur (S) 2p orbits of the as-grown $MoS_2$.
Figure 7C:
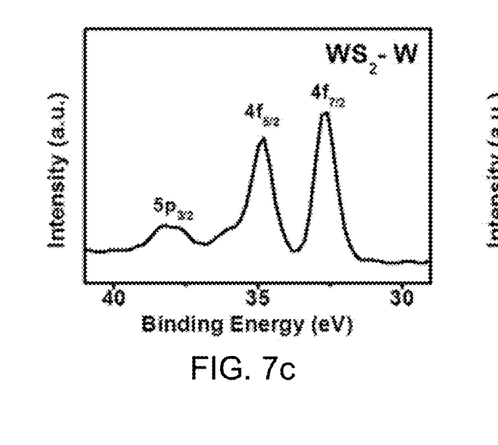
FIG. 7c plots the x-ray photoelectron spectra for the tungsten (W) 4f orbits of the as-grown $WS_2$.
Figure 7D:
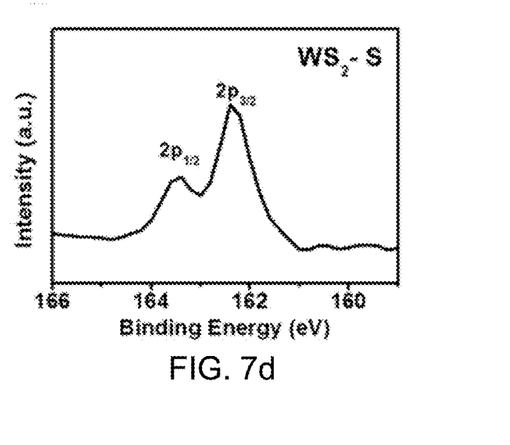
FIG. 7d plots the x-ray photoelectron spectra for the sulfur (S) 2p orbits of the as-grown $WS_2$.

A field-emission transmission electron microscope (JEOL JEM-2100F, operated at 200 kV with a point-to-point resolution of 0.19 nm) equipped with an energy dispersive spectrometer (EDS) was used to obtain information regarding the microstructures and the chemical compositions of the formed layers. The TEM samples were prepared using lacy-carbon Cu grids and suspended $MS_2$ nanosheets in DI water. In FIG. 6b, the selected area electron diffraction (SAED) patterns with a [001] zone were taken at four different areas, as marked in FIG. 6a. Distinct SAED patterns with the same orientation are seen in the areas with different thicknesses, indicating that the few-layer triangular domain is single-crystal without any mis-orientations in the stacking of layers. The transmission-electron-microscope energy-dispersive x-ray (TEM-EDX) spectra of the as-grown $MoS_2$ and $WS_2$ is provided in FIG. 6c.

Figure 8A:
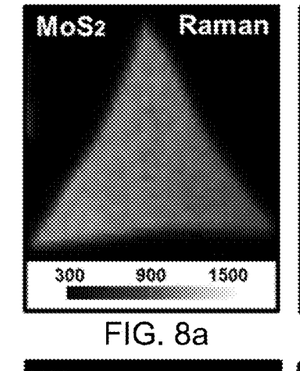
FIG. 8a maps the Raman peak intensity of a $MoS_2$ monolayer.
Figure 8B:
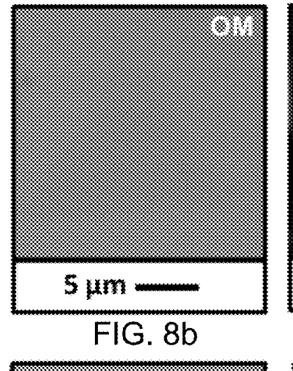
FIG. 8b provides an OM image of the $MoS_2$ monolayer.
Figure 8C:
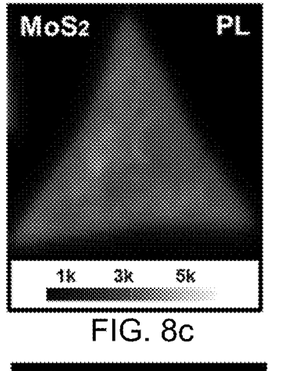
FIG. 8c provides the photoluminescence (PL) peak intensity of a $MoS_2$ monolayer.
Figure 8D:
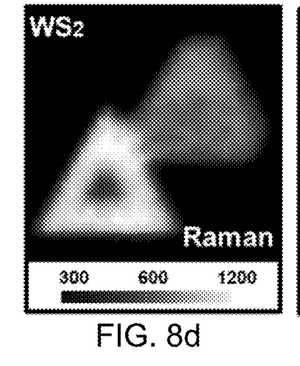
FIG. 8d maps the Raman peak intensity of $WS_2$ flakes.
Figure 8E:
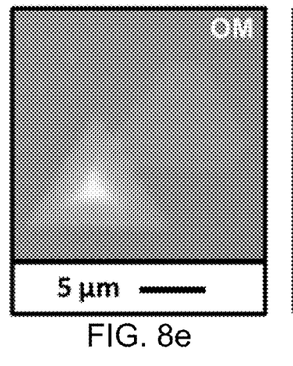
FIG. 8e provides an OM image of the $WS_2$ flakes.
Figure 8F:
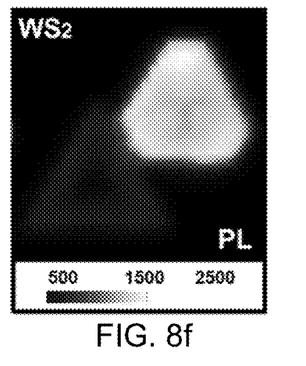
FIG. 8f provides the photoluminescence peak intensity of the $WS_2$ flakes.
Figure 8G:
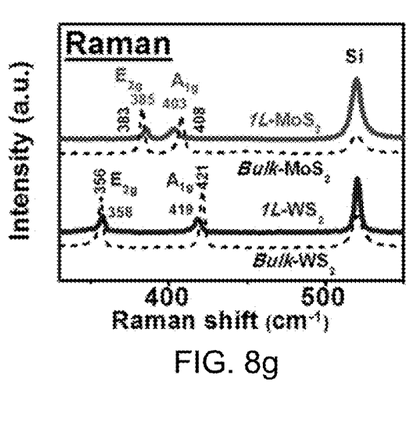
FIG. 8g provides a comparison of the $MS_2$ monolayer and bulk for Raman spectra.
Figure 8H:
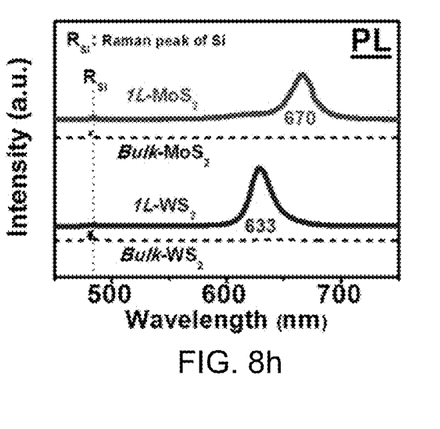
FIG. 8h provides a comparison of the $MS_2$ monolayer and bulk for photoluminescence spectra.

The spectroscopy and photoluminescence (PL) performance of the as-grown $MS_2$ are evidenced by the Raman and photoluminescence mapping in confocal measurements shown in FIGS. 8g and 8h. Raman spectra and photoluminescence were obtained by confocal Raman microscopic systems (NT-MDT), specifically in a confocal spectrometer using a 473-nm excitation laser. The wavelength and spot size of the laser were 473 nm and 0.4 μm, respectively. The silicon peak at 520 $cm^{-1}$ was used for calibration in these experiments. Raman and photoluminescence mapping was constructed by plotting the integrated $MS_2$ Raman peak intensity (360~420 $cm^{-1}$ for $MoS_2$, 330~440 $cm^{-1}$ for $WS_2$) and the photoluminescence intensity (640~700 nm for $MoS_2$, 600~680 nm for $WS_2$) in the confocal measurements. The thermal stability of PTAS was examined by thermogravimetric analysis (TGA, TA Instrument TGA2950) with an argon flow. The PTAS solution was heated and kept at 150° C. for 30 minutes to remove the solvent of water. Then, the PTAS was heated to 1000° C. with an increasing rate of 10° C./min.

The surface morphology of the samples was examined with an optical microscope (OM), a commercial atomic force microscope (AFM, Digital instrument 3100) and a scanning electron microscope (SEM, FEI VS600). Device characterization was performed using an Agilent 41550 semiconductor parameter analyzer and a Lakeshore cryogenic probe station with micromanipulation probes.

A similar process was carried out for field-effect transistors (FETs) of $MoS_2$ and $WS_2$ monolayers deposited via CVD. First, poly(methyl methacrylate) (PMMA, 950k MW) resist was spun on the as-grown $MS_2$ samples and patterned using standard electron-beam lithography. Metal stacks of 5 nm Ti/50 nm Au were then deposited to form direct contact with the as-grown $MoS_2$ and $WS_2$, followed by lift-off of the layers after contact. The FETs of the as-grown $WS_2$ monolayers were measured under ultraviolet radiation to extract their carrier density from the Schottky contacts between $WS_2$ and the metal electrodes. All measurements were taken in a low-pressure vacuum (with a pressure of ~$10^{-5}$ Torr) at room temperature to reduce the hysteresis.

A uniform contrast and strong intensity are observed in the Raman plots (i.e., FIGS. 8a and 8d) and in the photoluminescence mapping plots (i.e., FIGS. 8c and 8f), implying that the $MS_2$ exhibits high crystallinity and high uniformity. The $A_{1g}$ Raman mode is very sensitive to layer number, and the peak frequency difference between the $E_{2g}$ and $A_{1g}$ modes can be used to identify the layer number of $MoS_2$. In FIG. 8g, the $E_{2g}$ and $A_{1g}$ modes of the Raman band of single-layer $MoS_2$ are located at 385 and 403 $cm^{-1}$, respectively, with full-width-half-maximum (FWHM) values of 3.5 and 6.6 $cm^{-1}$, while those of the bulk $MoS_2$ are at 383 and 408 $cm^{-1}$ with FWHM values of 4.1 and 3.3 $cm^{-1}$. In contrast, the Raman $E_{2g}$ and $A_{1g}$ energies of $WS_2$ are less sensitive to layer thickness, where the $E_{2g}$ and $A_{1g}$ modes of single-layer $WS_2$ are located at 358 and 419 $cm^{-1}$ with FWHM values of 4.3 and 5.3 $cm^{-1}$, while those of bulk $WS_2$ are at 356 and 421 $cm^{-1}$ with FWHM values of 3.6 and 3.5 $cm^{-1}$, respectively.

The Raman intensity of $MS_2$ increases with thickness, whereas the photoluminescence intensity of $MS_2$ rapidly decreases with an increase in layer number (compare FIG. 8g with 8h). The photoluminescence peaks of as-grown $MoS_2$ and $WS_2$ are approximately located at 670 and 633 nm, which is consistent with the published bandgap. Note that the photoluminescence peak of single-layer $MS_2$ is much stronger than the Raman signal, indicating high crystallinity and a low defect concentration in the as-grown $MS_2$ monolayer.

Figure 9A:
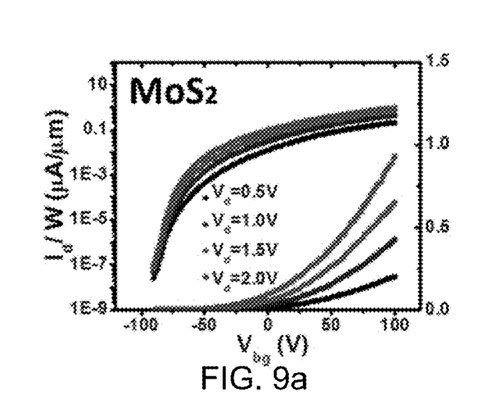
FIG. 9a plots transport characteristics of field-effect transistors (FETs) fabricated on as-grown $MoS_2$ on a linear scale (right y-axis) and on a log scale (left y-axis).
Figure 9B:
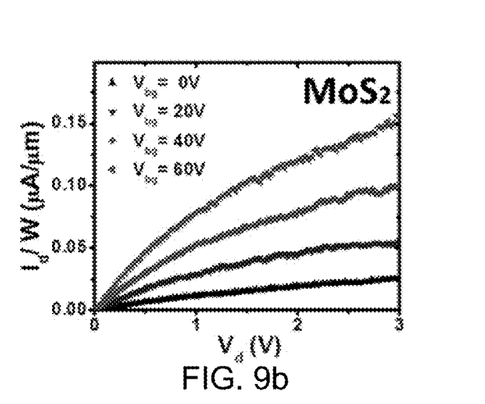
FIG. 9b plots output characteristics of the $MoS_2$ FET, where the current is linear with the source drain voltage in the low electronic field region, indicating that the metal electrodes form ohmic contact with $MoS_2$.
Figure 9C:
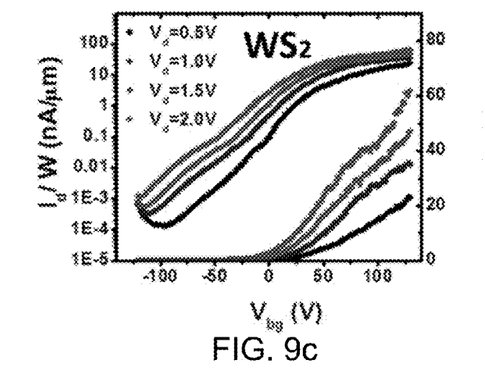
FIG. 9c plots transport characteristics of the FET fabricated on an as-grown $WS_2$ monolayer on a linear scale (right y-axis) and a log scale (left y-axis).
Figure 9D:
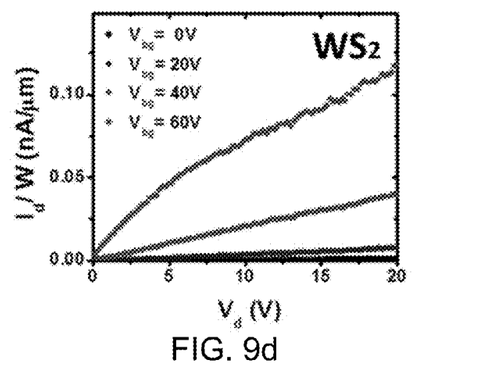
FIG. 9d plots output characteristics of the $WS_2$ FET.

To evaluate the electrical performance of the as-grown $MS_2$ monolayer, we fabricated bottom-gated transistors with the as-grown samples on $SiO_2$/Si. FIGS. 9a-9d show a typical electrical performance of $MS_2$ field-effect transistors (FETs). Both compositions show n-type behavior. We extract the field-effect electron mobility from the linear regime of the transfer properties using the equation, $\mu=[dI_d/dV_{bg}]\times[L/(WC_{ox}V_d)]$, where L, W and $C_{ox}$ are the channel length, width and the gate capacitance per unit area, respectively. Here, L=1 μm. From the characteristics of the $MoS_2$ FET shown in FIG. 9a, the on-off current ratio exceeds $10^7$, and the mobility is up to 1.2 $cm^2/V·s$, which is comparable to an exfoliated $MoS_2$ monolayer fabricated without high-k dielectrics. The excellent electrical performance of the $MoS_2$ FET demonstrates low defects and the high quality of this single-layer $MoS_2$. To estimate the doping level of as-grown $MoS_2$, the source/drain current at zero gate voltage was modeled as $I_d=qn_{2D}W\mu(V_d/L)$, where $n_{2D}$ is the two-dimensional carrier concentration; q is the electron charge; μ is the calculated mobility; and $V_d$ is the source/drain voltage, respectively. From the output characteristics of as-grown $MoS_2$ (FIG. 9b), $n_{2D}$ is extracted to be ~$5.2\times10^{10}$ $cm^{-2}$. FIGS. 9c and 9d show the electrical characterizations of $WS_2$ FETs. The on-off ratio is approximately $10^5$, and the mobility is around 0.01 $cm^2/V·s$, which is relatively low compared to that of the $MoS_2$-based FET. Since, however, this is believed to be the first FET based on CVD-grown $WS_2$, the metal electrodes may be optimized in the future to improve the performances.

Figure 10A:
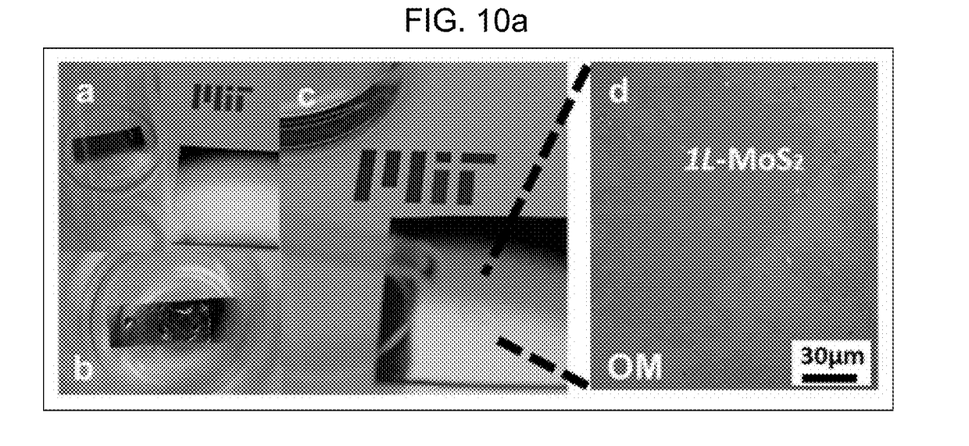
FIG. 10a includes (a) a photographic image of as-grown $MoS_2$ sample on a $SiO_2$/Si substrate contained in a bottle, with a clean $SiO_2$/Si substrate on the right; (b) a photographic image of the sample with the as-grown monolayer peeling off and breaking into small pieces in the de-ionized water; (c) a photographic image showing the drying of a droplet of the $MoS_2$ nanosheets solution; and (d) an enlarged OM image of the transferred $MoS_2$ nanosheets on the $SiO_2$/Si substrate.
Figure 10B:
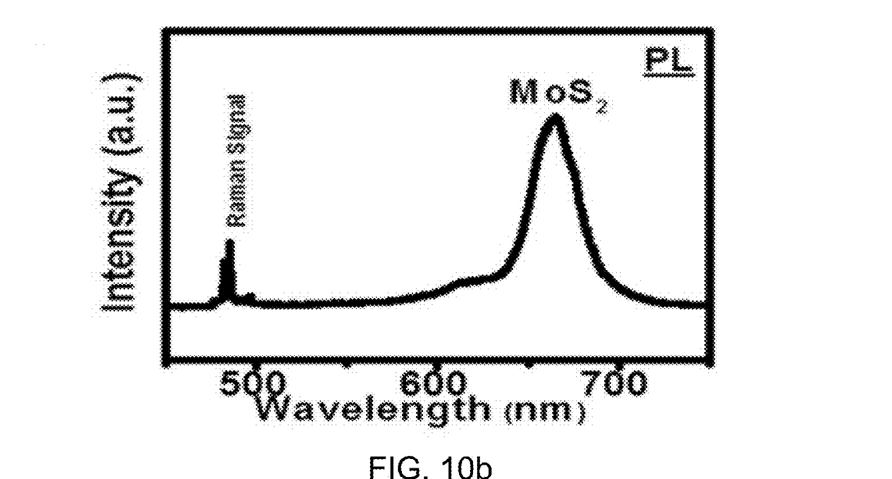
FIG. 10b plots the Raman signal and photoluminescence spectrum of the transferred $MoS_2$ nanosheets.

FIG. 10a demonstrates the mass production of single-layer $MoS_2$ nanosheets in de-ionized (DI) water. After a sample of an as-grown $MoS_2$ monolayer on a $SiO_2$/Si growth substrate was put into a bottle (a), DI water was added to the bottle (b) and passed underneath the $MoS_2$ monolayer, causing the $MoS_2$ monolayer to rapidly peel off the growth substrate at different locations and break into small flakes that were suspended in the solution. A solution of $MoS_2$ nanosheets was thus formed; and a drop of this solution was put onto another (clean) $SiO_2$/Si target substrate using a pipette (c). After a gentle heating at 50° C. to dry off the target substrate, the deposited $MoS_2$ flakes were found on the surface of the $SiO_2$/Si target substrate with a flake size ranging from 1~60 μm (d). Moreover, these transferred $MoS_2$ flakes retained their excellent photoluminescence performance and Raman intensity (as shown in FIG. 10b), suggesting that the water-only transfer can extensively avoid damage and contamination in the transfer process, which points to a simple way to achieve mass production of high-quality LTMD nanosheets without any additional treatments or annealing.

As the growth temperature of $MS_2$ monolayers are relatively high, temperature-sensitive substrates (such as polymer-based substrates) were not used in the growth stage of this synthetic process. It is advantageous to develop a transfer technique to implement large-area $MS_2$ on even more versatile types of substrates. Here, we report a transfer technique that maintains the quality of the as-grown monolayer.

In one embodiment, an as-grown $MoS_2$ monolayer sample and underlying growth substrate was cut into three pieces, and these samples were respectively treated with de-ionized (DI) water, isopropyl alcohol (IPA), and acetone for 30 seconds. The surface of the as-grown monolayer was hydrophobic, so the IPA and acetone respectively spread out on the second and third $MoS_2$ monolayers, whereas the water remained in droplet form on the first $MoS_2$ monolayer. During the 30 seconds of exposure to the water, the first as-grown $MoS_2$ monolayer started breaking into small pieces and floating on the water droplet. Thus, the as-grown $MoS_2$ monolayer can be easily removed from the growth substrate with DI water. We did not observe such lift-off behaviors for the organic solvents used with the second and third samples. It is suspected that the DI water in the $MoS_2$-substrate interface assists the lift-off of the $MoS_2$ monolayer from the growth substrate because of the high solubility of PTAS in water and because of the hydrophobic surfaces of $MoS_2$.

Figure 11A:
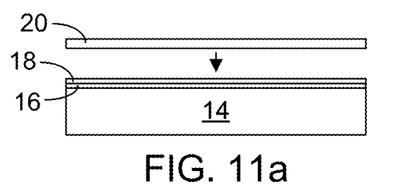
FIGS. 11a-c schematically illustrate a process for transferring a $MX_2$ monolayer from a growth substrate to a target substrate.
Figure 11B:
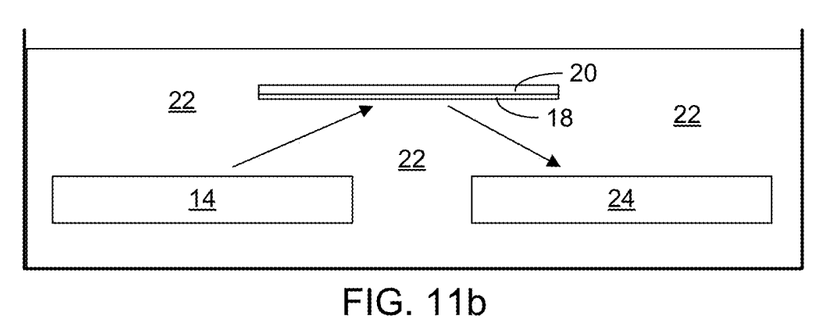
Figure 11C:
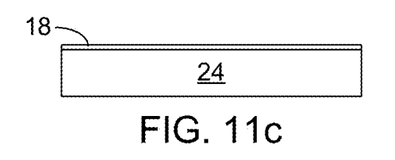

The transfer of the entire monolayer was also demonstrated using polydimethylsiloxane (PDMS), as a transfer medium, and water. As shown in the schematic illustration of a transfer process in FIG. 11a, the PDMS transfer layer 20 can be applied and adhered to the monolayer 18, while the monolayer 18 is still attached to the growth substrate 14. As the seeding layer 16 is dissolved, as shown in FIG. 11b, the monolayer 18 is released into the water 22 in a clean and continuous form with the transfer layer 20 still adhered. Using the PDMS transfer layer 20 as a stamp, the transfer of $MS_2$ monolayers 18 to other (target) substrates 24 can be implemented. Single-layer $MoS_2$ can be well transferred to highly ordered pyrolytic graphite (HOPG) or to a flexible polyethylene terephthalate (PET) target substrate with direct stamping (wherein the single-layer $MoS_2$ is removed with DI water; PDMS is attached to the $MoS_2$ surface; and the $MoS_2$ layer is then stamped onto the target substrate), which may enhance developments in flexible optoelectronics and STM-related studies. When the $MoS_2$ monolayer 18 is transferred to a target substrate 24, the PDMS transfer layer 20 can be peeled off, leaving the $MoS_2$ monolayer 18 exposed on the target substrate 24, as shown in FIG. 11c.

Figure 11D:
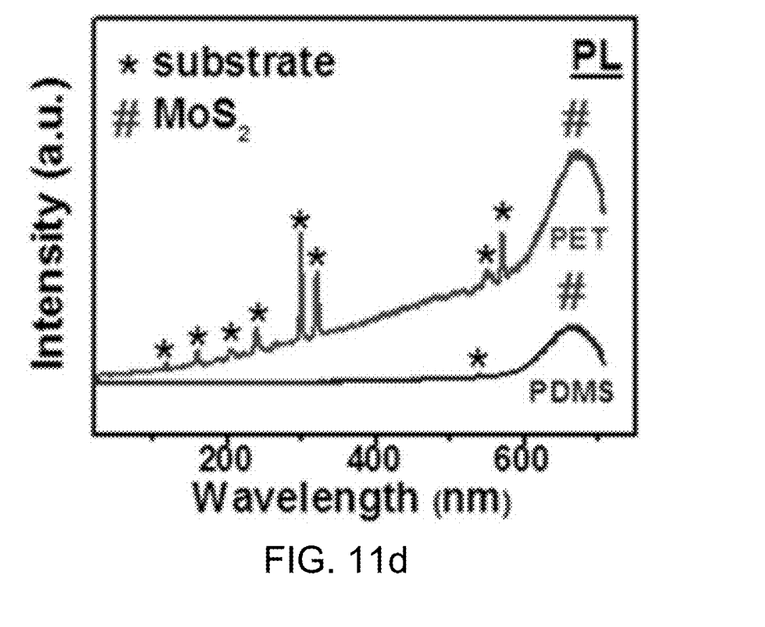
FIG. 11d shows the photoluminescence spectra of transferred $MoS_2$ on PET and PDMS surfaces; the photoluminescence experiments were performed using a 532-nm excitation laser.

Strong photoluminescence of the transferred $MoS_2$ monolayer on PDMS and PET surfaces is observed in FIG. 11d, illustrating that the quality of the $MoS_2$ monolayer was maintained after its removal from the growth substrate. Since only a drop of water was involved in the transfer process, contamination was avoided. Moreover, hybrid structures based on a LTMD monolayer and functional materials, including conductive graphene, insulating h-BN, and multiferroic $BiFeO_3$, were successfully fabricated using direct stamping. Thus, this approach may stimulate development of various novel hybrid structures and functional materials based on LTMD monolayers.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:
1. A method for producing a metal dichalcogenide layer on a transfer substrate, comprising:
    seeding aromatic molecules on a surface of a growth substrate;

growing a layer of a metal dichalcogenide via chemical vapor deposition on the growth substrate surface seeded with aromatic molecules; and contacting the seeded aromatic molecules with a solvent that dissolves the seeded aromatic molecules to release the metal dichalcogenide from the growth substrate, wherein the growth substrate remains intact as the seeded aromatic molecules are dissolved to release the metal dichalcogenide.

2. The method of claim 1, further comprising adhering a transfer medium to the metal dichalcogenide layer before the metal dichalcogenide layer is released from the growth substrate.

3. The method of claim 2, where the transfer medium includes a polymer selected from polydimethylsiloxane (PDMS) and poly(methyl methacrylate) (PMMA).

4. The method of claim 1, further comprising, after the metal dichalcogenide layer is released from the growth substrate, applying the metal dichalcogenide layer to a target substrate.

5. The method of claim 4, wherein the target substrate comprises a composition selected from quartz, sapphire and silica.

6. The method of claim 1, wherein the metal dichalcogenide has a composition represented by the formula, $MX_2$, where M includes a metal selected from molybdenum (Mo) and tungsten (W), and where X is a chalcogen selected from sulfur (S), selenium (Se) and tellurium (Te).

7. The method of claim 6, wherein X is sulfur.

8. The method of claim 7, wherein M is molybdenum.

9. The method of claim 8, wherein the $MoS_2$ layer is grown at a temperature of about 650° C.

10. The method of claim 7, wherein M is tungsten.

11. The method of claim 10, wherein the $WS_2$ layer is grown at a temperature of about 800° C.

12. The method of claim 6, wherein the sulfur is evaporated into a vapor phase and carried with argon gas flow in the chemical vapor deposition.

13. The method of claim 12, wherein the metal is supplied as $MO_3$ in the chemical vapor deposition.

14. The method of claim 1, wherein the chemical vapor deposition is performed at ambient pressure.

15. The method of claim 1, wherein the aromatic molecules are seeded in de-ionized water.

16. The method of claim 1, wherein the aromatic molecules are selected from reduced graphene oxide (r-GO), perylene-3,4,9,10-tetracarboxylic dianhydride (PTCDA), and perylene-3,4,9,10-tetracarboxylic acid tetrapotassium salt (PTAS).

17. The method of claim 1, wherein the metal dichalcogenide layer is a monolayer.

18. The method of claim 1, wherein the growth substrate comprises $SiO_2/Si$.

19. A method for producing a metal dichalcogenide layer on a transfer substrate, comprising:

seeding aromatic molecules on a surface of a growth substrate;

growing a layer of a metal dichalcogenide via chemical vapor deposition on the growth substrate surface seeded with aromatic molecules; and contacting the seeded aromatic molecules with a solvent that dissolves the seeded aromatic molecules to release the metal dichalcogenide from the growth substrate, wherein the solvent consists essentially of deionized water.

* * * * *